(12) United States Patent
Shih et al.

(10) Patent No.: US 7,521,321 B2
(45) Date of Patent: Apr. 21, 2009

(54) METHOD OF FABRICATING A NON-VOLATILE SEMICONDUCTOR MEMORY DEVICE

(75) Inventors: Yen-Hao Shih, Banqiao (TW); Ming-Hsiang Hsueh, Hsinchu (TW); Erh-Kun Lai, Longjing Shiang (TW); Chia-Wei Wu, Jhubei (TW); Chi-Pin Lu, Hsinchu (TW); Jung-Yu Hsieh, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 229 days.

(21) Appl. No.: 11/693,716

(22) Filed: Mar. 30, 2007

(65) Prior Publication Data

US 2008/0164513 A1 Jul. 10, 2008

Related U.S. Application Data

(60) Provisional application No. 60/879,224, filed on Jan. 8, 2007.

(51) Int. Cl.
*H01L 21/336* (2006.01)
(52) U.S. Cl. ...................... 438/264; 438/266
(58) Field of Classification Search .............. 438/263, 438/264, 266
See application file for complete search history.

(56) References Cited

U.S. PATENT DOCUMENTS 7,388,252 B2 * 6/2008 Lung ......................... 257/315

* cited by examiner

*Primary Examiner*—Jack Chen
(74) *Attorney, Agent, or Firm*—Jianq Chyun IP Office

(57) ABSTRACT

The present invention relates to a memory device and a method of fabricating the same. The memory device comprises a substrate, a tunnel dielectric film on the substrate, pairs of source and drain regions formed in the substrate, and a number of separate storage blocks between each pair of the source and drain regions. Each storage wire block includes a storage medium and a silicon dioxide layer. Two storage blocks are separated by an interval of at least 100 angstroms.

17 Claims, 5 Drawing Sheets

METHOD OF FABRICATING A NON-VOLATILE SEMICONDUCTOR MEMORY DEVICE

BACKGROUND OF THE INVENTION

1. Field of the Invention

This invention generally relates to a semiconductor device, and more particularly, to a non-volatile semiconductor memory device and a method of fabricating the same.

2. Background of the Invention

Flash memory is a type of non-volatile memory, which can retain its content without consumption of power and can be written to and erased multiple times. One type of flash memory stores information in an array of floating gate transistors, each of which (called "cell") generally stores one bit of information. Newer devices, sometimes referred to as multi-level-cell devices, may store more than one bit per cell, by using more than two levels of electrical charge placed on the floating gate of a cell. Multi-level-cell devices may double memory capacity but they may suffer slower reading and write operations.

One type of flash memory is known as nitride read only memory. Nitride read only memory may include an array of nitride read only memory cells for data storage. Each nitride read only memory cell may include a source, a drain and a gate structure formed on a p-type substrate. The gate structure may include a polysilicon layer overlaying an oxide/nitride/oxide (ONO) stacked layer, with the nitride layer serving as charge trapping layer. Each nitride read only memory cell may store one or more bits of data. For example, dual bit memory devices allow storage of two bits of data in a single cell, one bit being stored in the trapping layer proximate to the source region and the other being stored in the trapping layer proximate to the drain region.

In multi-bit memory devices that utilize an ONO stacked layer to store charges, the charge added or removed during programming (i.e., write) and erase operations should be confined to the respective source and drain regions of a cell. However, in reality, as gate length is scaled down below 65 nm, the charges in one of the source and drain regions may overlap with the charges in the other region, thus changing the reading, programming and erase characteristics of the cell over time. Eventually, the overlap of two groups of charges changes the threshold voltages for determining the state of the respective bits in a cell and thus causes unreliable bit sensing.

In addition, a memory with a floating gate structure may encounter the issue of stress-induced leakage current, especially when the memory device shrinks (i.e., the memory has a thinner tunnel oxide film) and when the voltage is applied on the drain terminal of a memory cell. In other words, the memory device may have a leakage path at a weak point on the tunnel oxide film and thus the data is lost through the leakage path.

BRIEF SUMMARY OF THE INVENTION

One example consistent with the invention provides a method to split a memory storage medium into a number of separate storage blocks for achieving multi-bit operation with charge confinement. The storage medium can be a conductor or an insulator with charge trapping ability.

Another example consistent with the invention provides a method of fabricating a memory device comprising providing a substrate, providing a tunnel dielectric film on the substrate, providing a charge storage stack with a storage medium layer and a thin silicon layer over the tunnel dielectric film, providing a second dielectric layer on the charge storage stack, forming pairs of source and drain regions under the tunnel dielectric film, and forming a number of storage blocks between each pair of source and drain regions by separating the charge storage stack using photoresistless etching process.

In another example, a method of fabricating a memory device comprises providing a substrate, providing a tunnel oxide film on the substrate, providing a charge storage stack with a storage medium layer and a thin silicon layer on the tunnel oxide film, providing a nitride layer on the charge storage stack, forming source and drain regions under the tunnel oxide film, forming a number of separate storage blocks by separating the charge storage stack using a photoresistless etching process, providing one of a blocking oxide film and an interpoly dielectric layer on the separate storage blocks and the tunnel oxide film, providing a gate material, and forming a gate structure by photolithography and reactive ion etching.

One example consistent with the invention provides memory cells in a memory with a number of separate storage blocks for multi-bit operation with charge confinement.

Another example consistent with the invention provides a memory cell which comprises a substrate, a tunnel dielectric film on the substrate, pairs of source and drain regions formed in the substrate, and a number of separate storage blocks between each pair of the source and drain regions. Each storage block includes a storage medium and a silicon dioxide layer. Two storage blocks are separated by an interval of at least 100 angstroms.

It is to be understood that both the foregoing general description and the following detailed description are exemplary only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended, exemplary drawings. It should be understood, however, that the invention is not limited to the precise arrangements and instrumentalities shown.

In the drawings.

DETAILED DESCRIPTION OF THE INVENTION

Figure 1:
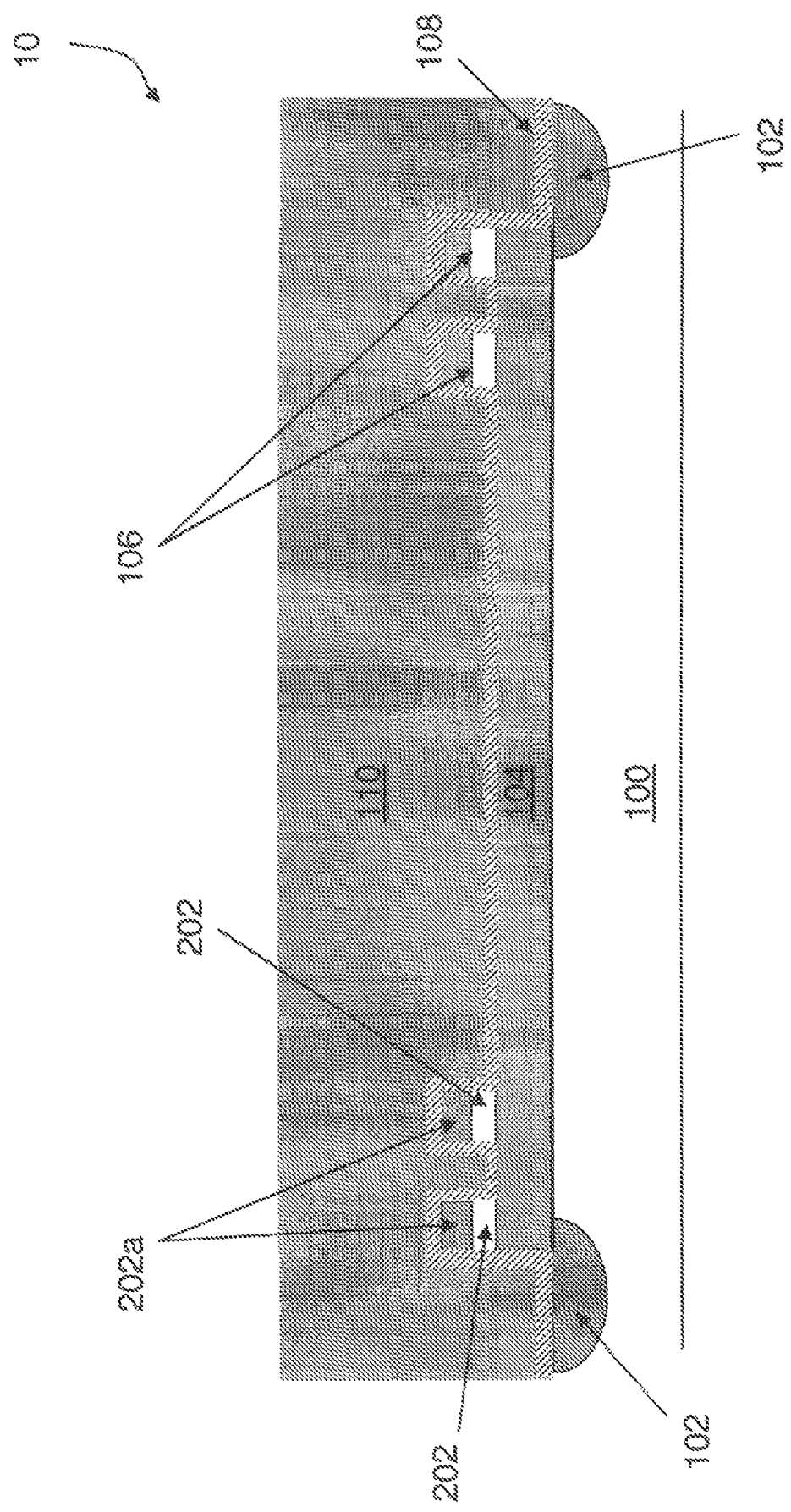
FIG. 1 shows the cross-sectional structure of an exemplary embodiment of a memory cell according to the present invention.

FIG. 1 illustrates an exemplary structure of a non-volatile memory cell 10 in examples consistent with the invention. The non-volatile memory cell 10 includes a substrate 100, source/drain (S/D) regions 102, a tunnel oxide film 104 over the S/D regions 102, four separate storage blocks 106 on the tunnel oxide film 104 between the S/D regions 102, a blocking oxide film or an interpoly dielectric layer 108 over the tunnel oxide film 104 and the storage blocks 106, and a layer of gate materials 110 over the blocking oxide film or the interpoly dielectric layer 108. Each storage block 106 includes a storage medium layer 202 and a silicon dioxide layer 202a. The storage medium layer 202 for storing charges may be made of conductive materials, including silicon, polysilicon, silicon germanium, metal, or a charge trapping material such as silicon nitride, aluminum oxide, or silicon oxynitride. In one example consistent with the present invention, the storage medium layer 202 may be silicon as in floating gate transistors or nitride as in nitride read only memory or SONOS devices.

Figure 2:
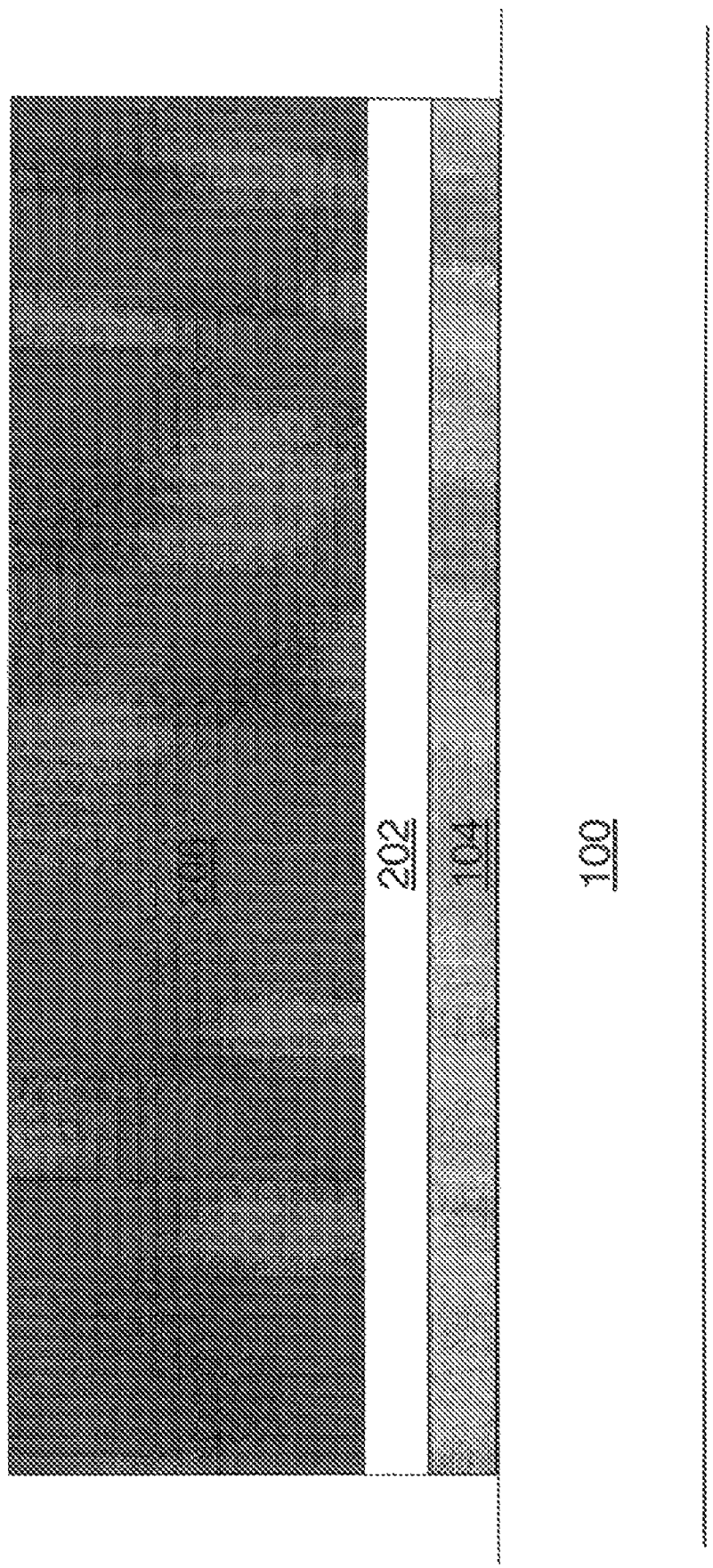
FIG. 2 is a sectional view of a memory cell in FIG. 1 showing an exemplary manufacturing method according to the present invention.

FIGS. 2-5 are sectional views of a non-volatile memory cell showing a method of fabricating a memory cell of FIG. 1. As shown in FIG. 2, a tunnel oxide film 104 with thickness of 2 nm to 10 nm is formed on a silicon substrate 100 by thermal oxidation. The silicon substrate 100 may be a p-type silicon substrate for fabricating an n-channel transistor, or alternatively, an n-type silicon substrate for a p-channel transistor. The thickness of the silicon substrate 100 may be 10 nm to 3000μ. A charge storage stack 202 is formed over the tunnel oxide film 104. The charge storage stack 202 includes a storage medium layer and a thin silicon layer. Specifically, where using silicon as storage medium, silicon is formed on the tunnel oxide film 104 by chemical vapor deposition (CVD) to a thickness of 5 nm to 200 nm. The bottom portion of the silicon with thickness of 3 nm to 198 nm may be defined as the storage medium layer for storing charges and the upper portion with thickness of 2 nm may be defined as a thin silicon layer. Where a nitride is used as storage medium, a silicon nitride film is formed on the tunnel oxide film 104 by CVD. A thin silicon layer with thickness of 2 nm is then deposited over the nitride film to form a nitride-silicon charge storage stack 202. A nitride film 206 with thickness of 160 nm is formed over the stack 202 by CVD.

Figure 3:
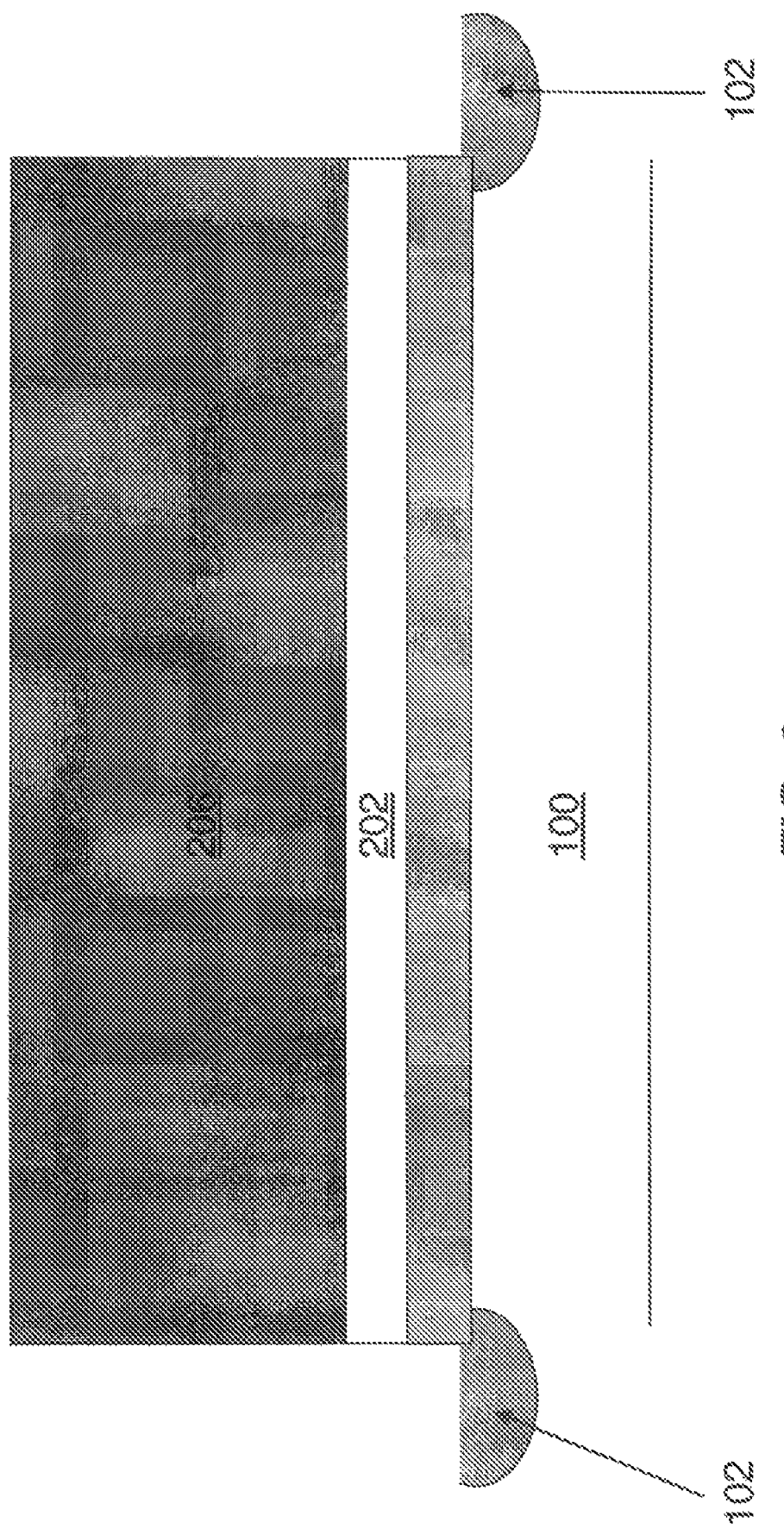
FIG. 3 is a sectional view of a memory cell in FIG. 1 showing an exemplary manufacturing method according to the present invention.
Figure 4:
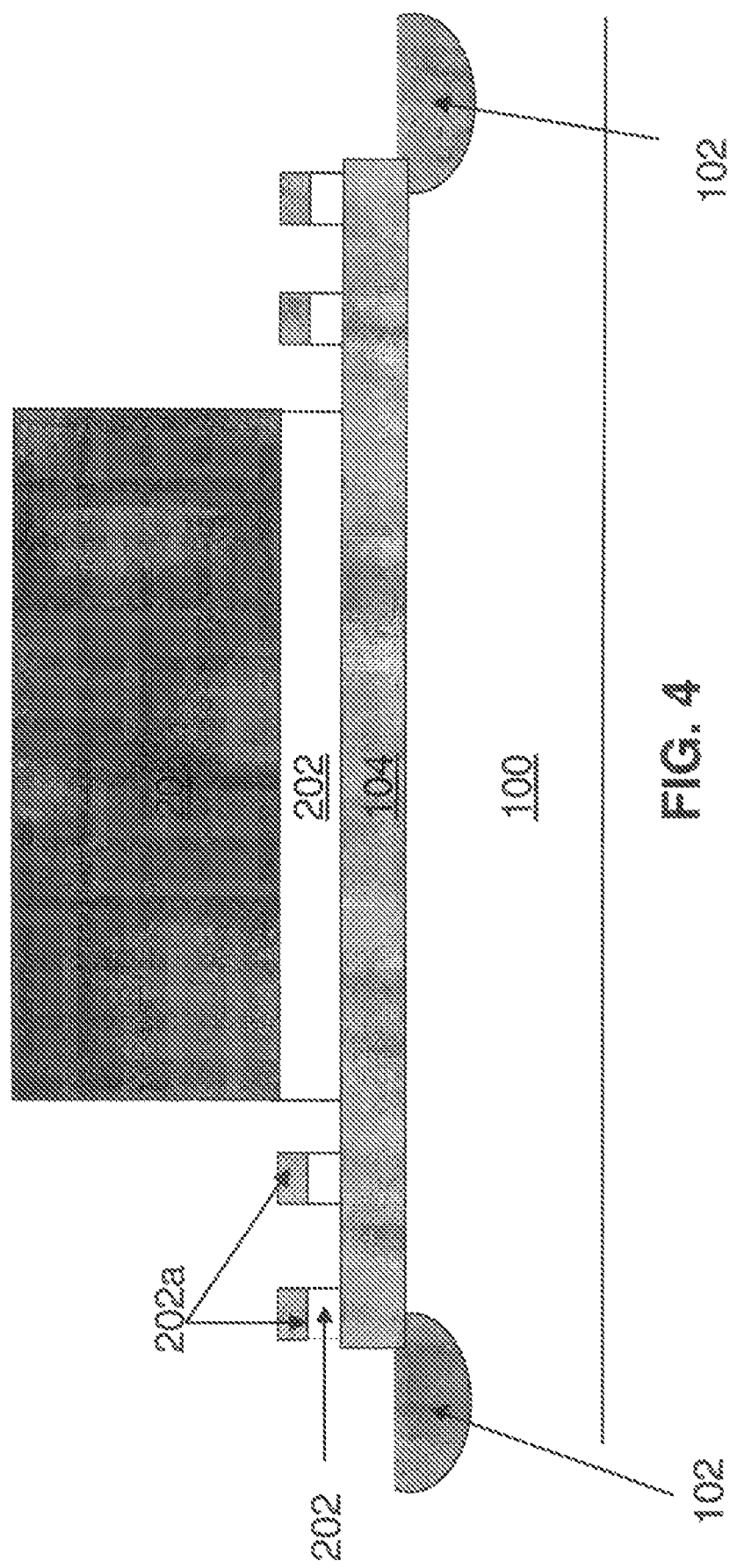
FIG. 4 is a sectional view of a memory cell in FIG. 1 showing an exemplary manufacturing method according to the present invention.

Referring to FIG. 3, a photoresist (not shown) is first coated on the surface of the nitride film 206 and is then patterned to expose portions of the tunnel oxide film 104 by using conventional photolithography and reactive ion etching (RIE). In addition, ion implantation is carried out to form source and drain regions 102 beneath the exposed tunnel oxide film 104 for bit line connections. FIG. 4 shows several separate storage blocks formed on the tunnel oxide film 104. The process of forming storage blocks is carried out by isotropic etching, instead of by lithography. The process includes first partially removing the nitride film 206 by wet etching, such as using hot phosphoric acid (HPA), thereby exposing a first portion of the charge storage stack 202. Then oxidation is performed on the thin silicon layer of the first exposed portion of the stack 202 to convert silicon into silicon dioxide and form silicon dioxide film 202a as an insulator. The oxidation may be performed by furnace or rapid thermal oxidation. Next, the nitride film 206 is again partially removed to expose a second portion of the charge storage stack 202. A removing process thereafter removes the second exposed portion of the stack 202, thereby exposing a portion of the tunnel oxide film 104 underneath. The process of forming storage blocks repeats to form a desired number of storage blocks on the tunnel oxide film 104 as shown at FIG. 4 where the process repeats twice. The use of isotropic etching by HPA to form storage blocks as described above allows the interval between two storage blocks to reach at least 100 angstroms. In addition, in the case where silicon nitride serves as the storage medium, the etching rate for the silicon nitride storage layer may be well controlled by using HPA due to its high selectivity and low etching rate.

Figure 5:
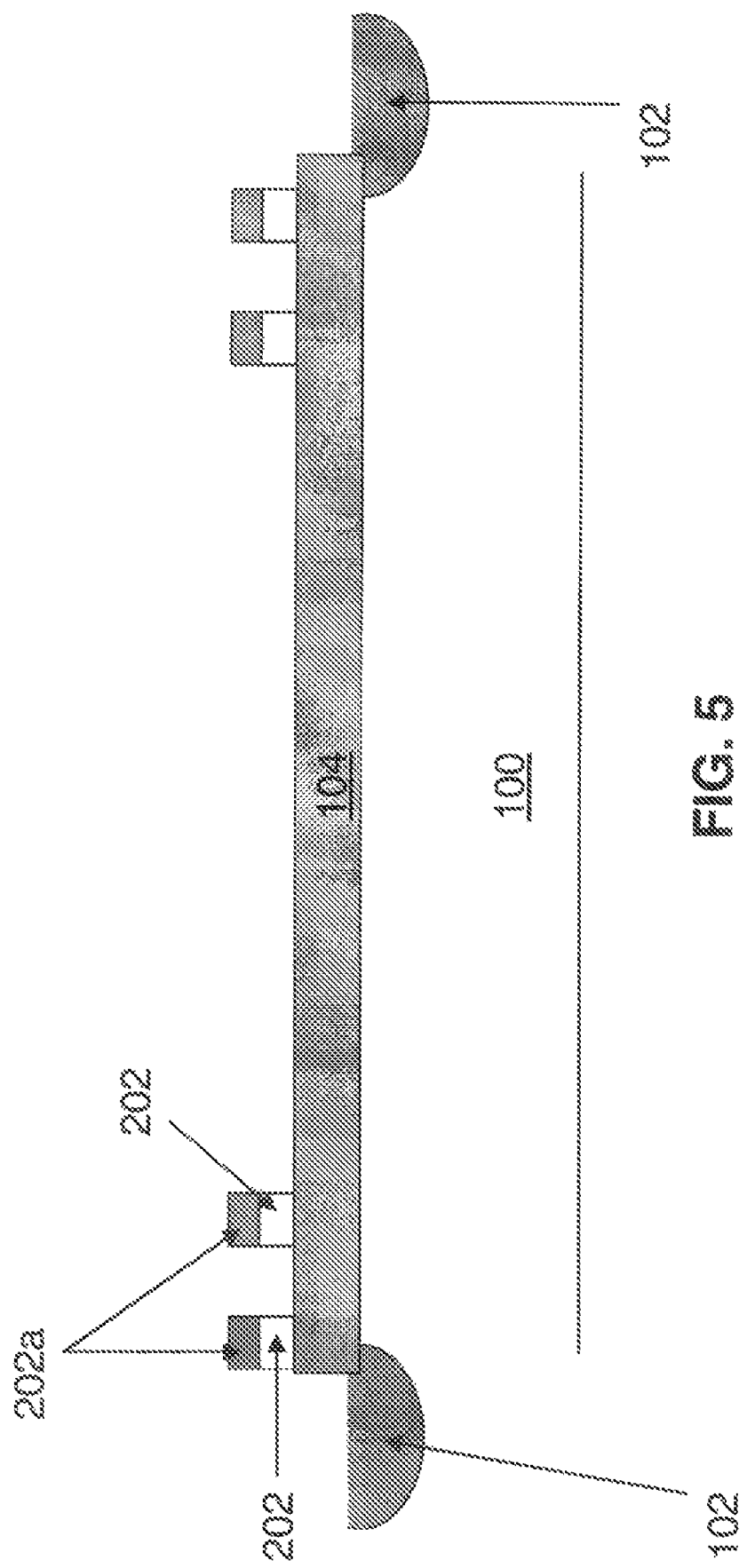
FIG. 5 is a sectional view of a memory cell in FIG. 1 showing an exemplary manufacturing method according to the present invention.

As shown in FIG. 5, the remaining nitride film 206 is completely removed by wet etching, for example, using HPA. In the case that the desired number of storage blocks is even, after removing the nitride film 206, the exposed charge storage stack 202 underneath the nitride film 206 may be removed to form a structure as shown in FIG. 5. Where silicon is used as storage medium, the entire exposed stack 202 may be removed by dry etching, such as by RIE. Where nitride is used as storage medium, the thin silicon layer of the stack 202 is removed by dry etching and the nitride underneath is subsequently removed by wet etching, such as by using HPA. As a result, referring to FIG. 5, four separate storage structures are formed between one pair of source/drain regions. A blocking oxide film 108 or an interpoly dielectric layer is subsequently deposited over the structure of FIG. 5. Following the blocking oxide film or the interpoly dielectric layer 108, a top film 110 of gate materials for word line structure, such as polycrystalline silicon, metal or silicide polycrystalline, is deposited on the blocking oxide film 108 to form the structure of FIG. 1. With several separate storage blocks to store data, the chance of stress-induced leakage current may be reduced.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method of fabricating a memory device, comprising:
   providing a substrate;
   providing a tunnel dielectric film on the substrate;
   providing a charge storage stack over the tunnel dielectric film, wherein the charge storage stack includes a storage medium layer and a thin silicon layer overlaying the storage medium layer;
   providing a second dielectric layer on the charge storage stack;
   forming pairs of source and drain regions under the tunnel dielectric film; and
   forming a number of storage blocks between each pair of source and drain regions by separating the charge storage stack using a photoresistless etching process.

2. The method of claim 1, wherein the storage medium layer is made of conductive materials.

3. The method of claim 1, wherein the storage medium layer is made of dielectric materials with charge trapping ability.

4. The method of claim 1, wherein two storage blocks are separated by an interval of at least 100 angstroms.

5. The method of claim 1 wherein forming a number of storage blocks comprises:
   partially removing the second dielectric layer to expose a first portion of the charge storage stack by wet etching;
   converting the thin silicon layer of the first exposed portion of the charge storage stack into silicon dioxide by oxidation;
   partially removing the second dielectric layer to expose a second portion of the charge storage stack;
   removing the second exposed portion of the charge storage stack to expose the tunnel oxide film; and
   repeating the above steps to form a number of separate storage blocks.

6. The method of claim 5, wherein the wet etching uses hot phosphoric acid.

7. The method of claim 5, wherein converting the thin silicon layer of the first exposed portion of the charge storage stack into silicon dioxide comprises using one of a furnace and rapid thermal oxidation.

8. The method of claim 5, wherein removing the second exposed portion of the charge storage stack comprises using reactive ion etching.

9. The method of claim 5 further comprising completely removing the remaining second dielectric layer to expose the remaining charge storage stack.

10. The method of claim 1 further comprising:
providing one of a blocking oxide film and an interpoly dielectric layer on the storage blocks and the tunnel dielectric film;
providing a gate material; and
forming a gate structure.

11. The method of claim 10, wherein the gate material is one of polysilicon, metal, and silicide poly.

12. The method of claim 10, wherein forming the gate structure comprises using photolithography and reactive ion etching.

13. A method of fabricating a memory device, comprising:
providing a substrate;
providing a tunnel oxide film on the substrate;
providing a charge storage stack over the tunnel oxide film, wherein the charge storage stack includes a storage medium layer and a thin silicon layer;
providing a nitride layer on the charge storage stack;
forming source and drain regions under the tunnel oxide film;
forming a number of storage blocks by separating the charge storage stack using a photoresistless etching process;
providing one of a blocking oxide film and an interpoly dielectric layer on the separate storage blocks and the tunnel oxide film;
overlaying a gate material; and
forming a gate structure by photolithography and reactive ion etching.

14. The method of claim 13, wherein two storage blocks are separated by an interval of at least 100 angstroms.

15. The method of claim 13 wherein forming a number of separate storage blocks comprises:
partially removing the nitride layer to expose a first portion of the charge storage stack by wet etching;
converting the thin silicon layer of the first exposed portion of the charge storage stack into silicon dioxide by oxidation;
partially removing the nitride layer to expose a second portion of the charge storage stack;
removing the second exposed portion of the charge storage stack to expose the tunnel oxide film; and
repeating the above steps to form a number of separate storage blocks.

16. The method of claim 15, wherein the wet etching uses hot phosphoric acid.

17. The method of claim 15 further comprising completely removing the remaining nitride layer to expose the remaining charge storage stack.

* * * * *